US006567588B2

(12) United States Patent
Unruh

(10) Patent No.: US 6,567,588 B2
(45) Date of Patent: May 20, 2003

(54) METHOD FOR FABRICATING CHIRPED FIBER BRAGG GRATINGS

(75) Inventor: James Owen Unruh, Allen, TX (US)

(73) Assignee: Photronics, Inc., Jupiter, FL (US)

( * ) Notice: Subject to any disclaimer, the term of this patent is extended or adjusted under 35 U.S.C. 154(b) by 0 days.

(21) Appl. No.: 09/940,947

(22) Filed: Aug. 28, 2001

(65) Prior Publication Data

US 2003/0048988 A1 Mar. 13, 2003

(51) Int. Cl.$^7$ ................................................. G02B 6/34
(52) U.S. Cl. ........................ 385/37; 385/31; 385/147; 65/31
(58) Field of Search ........................... 385/37, 31, 147; 65/31; 216/12

(56) References Cited

U.S. PATENT DOCUMENTS

| | | | |
|---|---|---|---|
| 5,499,134 A | | 3/1996 | Galvanauskas et al. |
| 5,718,738 A | | 2/1998 | Kohnke et al. |
| 6,160,261 A | | 12/2000 | Hoshino |
| 6,214,495 B1 | * | 4/2001 | Segawa et al. ................ 430/5 |
| 2002/0122626 A1 | * | 9/2002 | Rothenberg et al. .......... 385/37 |
| 2003/0006212 A1 | | 1/2003 | Segawa et al. |

OTHER PUBLICATIONS

R.C. Tiberio—Fabrication of electron beam generated, chirped, phase mask (1070.11–1070.66nm) for fiber Bragg grating dispersion compensator—American Vacuum Society—Nov. 1998.
Fiber Gratings Tutorial, Sabeus Photonics, Inc. No date.
MEBES Operation Manual Etec Systems, Inc. –Feb. 1999.
Art Krispin—Fiber Bragg Gratings—USC—EE558—Apr. 28, 2000.
Michael H. Lim—Fabrication Techniques for grating-based optical devices—American Vacuum Society—Nov. 1999.
J. Albert—Minimization of Phase Errors in Long Fiber Bragg Grating Phase Masks Made Using Electron Beam Lithography—Photonics Technology Letters, vol. 8, No. 10–Oct. 1996.
D.S. Starodubov—Ultrastrong Fiber Gratings and Their Applications—Sep. 20, 1999.
V. Grubsky—Fabrication of Long–Period Fiber Gratings with No Harmonics—IEEE Photonics Technology Letters, vol. 11, No. 1–Jan. 1999.

* cited by examiner

Primary Examiner—Rodney Bovernick
Assistant Examiner—Sung Pak
(74) Attorney, Agent, or Firm—Amster, Rothstein & Ebenstein

(57) ABSTRACT

A chirped Bragg grating is fabricated in an optical fiber by exposing the fiber to a coherent beam of light through a parallel phase mask having a series of progressively chirped segments produced on a lithography tool. The chirped phase mask is fabricated by exposing a photoresist-coated substrate to an image writing element such as an electron beam or a laser according to a set of parameters provided to the lithography tool. The parameters include a basic grating pattern for each segment, a value that defines the expansion or contraction of the grating pattern and an axis location to which the grating pattern is to be written to the substrate. By selecting machine commands that implement these parameters with a minimum throughput overhead, the mask can be produced in a reduced time, and therefore with increased accuracy.

5 Claims, 2 Drawing Sheets

METHOD FOR FABRICATING CHIRPED FIBER BRAGG GRATINGS

FIELD OF THE INVENTION

This invention relates to optical fiber Bragg gratings and, in particular to an improved method for writing masks for use in fabricating in-fiber chirped Bragg gratings.

BACKGROUND OF THE INVENTION

Optical fibers are essential components in modern telecommunications systems. Comprised of thin strands of glass, optical fibers enable the transmission of light, or optical signals, over long distances with little loss. An optical fiber typically has a core of glass having a specific index of refraction surrounded by a glass cladding having a lower index of refraction. Thus, light entering the fiber is retained within the core by internal reflection.

In applications wherein a single optical fiber carries signals on more than one wavelength, such as in wavelength division multiplexing (WDM), fiber Bragg gratings are used for controlling the specific wavelengths of light within the fiber. Fiber Bragg gratings also have other applications such as in fiber lasers. A typical Bragg grating comprises a length of optical fiber having periodic modulations in the index of refraction in its core, spaced equally along the length of the grating.

Several methods have been developed to fabricate fiber Bragg gratings. For example, the holographic, or interferometer method uses the interference patterns created at the intersection of two coherent light beams to induce index modulations directly in the optical fiber. A second fabrication method involves the use of a phase mask positioned close and parallel to an optical fiber on which the grating is to be formed. For example, by placing the phase mask between a coherent light source, such as a laser, and an optical fiber, the diffraction caused by the mask replicates the function of an interferometer, creating a plurality of divergent light beams that interfere with each other in a predictable pattern, resulting in periodic alterations in the refractive index of the exposed core of the optical fiber. Typically, fiber Bragg grating fabrication using a phase mask requires stripping away the cladding before exposure of the core, although gratings can be printed onto an unstripped fiber having a cladding that is transparent to the wavelength of light passing through the phase mask.

Because of their ability to selectively reflect specific wavelengths in a narrow bandwidth, while allowing the remaining wavelengths to pass essentially unimpeded, Bragg gratings are used as filters, stabilizers, dispersion compensators and for other applications in fiber optic systems. It is desirable, however, under certain circumstances to broaden the range of wavelengths affected by a Bragg grating. To accomplish this, a technique known as chirping is applied wherein the spacing between the periodic modulations in the refractive index (pitch) of an ordinary Bragg grating is gradually increased or decreased along the length of the grating. Thus a chirped fiber Bragg grating has a wider active bandwidth and a wavelength-dependent time delay because it has a wider range of spacings.

Although the characteristics of chirped fiber Bragg gratings are desirable, fabrication of such gratings has proven difficult and time-consuming. Particularly, the fabrication of chirped phase masks has been challenging. For example, a typical chirped Bragg grating phase mask may have an array of between 100 to 200 grating segments, each between 0.5 and 1.0 mm in length and with a pitch change between segments measured on the picometer scale. The pitch of each successive segment varies continuously from, and must be "stitched" or placed precisely relative to, the preceding segment. Conventional lithography tools such as an electron beam (e-beam) tool (for example, the MEBES III or MEBES 4500, both manufactured by Applied Materials, Inc. of Santa Clara, Calif.) have been unable to achieve the accuracy necessary to produce a phase mask for a chirped Bragg grating in a time period that makes them competitive.

A lithography tool uses an image writing element such as a laser beam or an electron beam to print an image, such as that of a phase mask onto a substrate. Thus exposed, the substrate can be processed such that a grating pattern comprising, for example, an array of alternating lines and spaces is etched into the substrate. On a MEBES tool in particular, phase mask fabrication has been attempted using a "scale factor" approach and is therefore particularly complex. Specifically, a basic unscaled segment, or grating pattern, is established having a predetermined address unit defining its size. The grating pattern is rescaled as needed by applying scale factors to the address unit. Scale factors are dimensionless values that are applied by the MEBES tool to the address unit to achieve the desired reduction or magnification of the grating pattern. When applied across an entire mask, a specific chirp, or rate of change in the grating period of the finished phase mask is the result.

FIG. 1 is a block diagram of the steps in fabricating a chirped fiber Bragg grating from a phase mask produced applying the scale factor method on lithography tool such as a MEBES tool which uses an electron beam as an image writing element. The first step, shown as 10, is to provide a photoresist coated substrate. As is common in the art, the substrate is often approximately 152×152×6.35 mm and is typically formed of amorphous quartz, due to its ability to transmit ultraviolet light, or of some other substantially transparent material. One of the major surfaces of the substrate is typically coated with 3000 to 5000 angstroms of photoresist material such as PBS or ZEP7000 over 1000 angstroms of a Cr/Cr oxide layer.

The second step, shown as 20 in FIG. 1, is to provide a grating pattern and the necessary scale factor and address unit values to the MEBES tool. The scale factor value to be applied to the grating pattern for each grating segment to be written onto the mask is established during the design and is known prior to the fabrication of the mask.

TABLE 1

| Scale Factor jobdeck example | |
|---|---|
| CHIP | 1, (1, PHASEDE-MO-TK, AD = 0.125, SF = 1.0738) |
| ROWS | 62500/13805.6585 |
| CHIP | 2, (1, PHASEDE-MO-TK, AD = 0.125, SF = 1.0738027, GC = 1) |
| ROWS | 62500/14304.97612775 |
| CHIP | 3, (1, PHASEDE-MO-TK, AD = 0.125, SF = 1.0738054, GC = 1) |
| ROWS | 62500/14804.295011 |
| CHIP | 4, (1, PHASEDE-MO-TK, AD = 0.125, SF = 1.0738081, GC = 1) |
| ROWS | 62500/15303.61514975 |
| CHIP | 5, (1, PHASEDE-MO-TK, AD = 0.125, SF = 1.0738108, GC = 1) |
| ROWS | 62500/15802.936544 |
| * * * | |
| CHIP | 199, (1, PHASEDE-MO-TK, AD = 0.125, SF = 1.0743346, GC = 1) |
| ROWS | 62500/112695.034811 |

TABLE 1-continued

Scale Factor jobdeck example

| | |
|---|---|
| CHIP | 200, (1, PHASEDE-MO-TK, AD = 0.125, SF = 1.0743373, GC = 1) |
| ROWS | 62500/113194.60102775 |

Table 1 is an excerpt of a typical jobdeck of the commands issued to a MEBES III or 4500, illustrating the commands instructing it to write the first five and last two of 200 grating segments on a particular substrate. The MEBES jobdeck addresses each segment as CHIP followed by the segment number. Referring to the jobdeck shown in Table 1, PHASEDE-MO-TK is the name arbitrarily given to the particular grating pattern from which the grating segments written to the substrate are modelled, AD is the address unit in microns prior to scaling and SF is the scale factor.

The address unit is chosen at the design stage, as with the scale factors, prior to the fabrication of the mask. AD is an integral divisor of the unscaled pitch of the grating pattern. A smaller value for AD results in increased accuracy and resolution, whereas a larger value results in an improved write time. For an unscaled pitch of 1.0 micron, the address unit is typically either 0.1 micron or 0.125 micron.

The location of the center of the grating segment follows the ROWS command, given as Y/X coordinates on an axis fixed relative to the substrate. As is well known in the art, a typical jobdeck provides all of these values established during the design phase for each of the grating segments in the mask.

Execution of the jobdeck by the lithography tool is the next step, shown in FIG. 1 as 30. In this step, the grating segments that comprise the chirped fiber Bragg grating phase mask are written one-by-one onto the photoresist coated substrate by exposing the photoresist to an image writing element such as an electron beam in a manner well known in the art. Control of the image writing element is carried out internally by the MEBES tool based upon the commands in the jobdeck. As shown in steps 30a–30e, the MEBES tool follows a specific set of procedures when called upon to write a grating segment to the substrate. First, as shown in 30a, the MEBES tool retrieves the scale factor value for the next segment and calculates a new base writing unit for the mask by applying the scale factor to the address unit, 30b.

In the next step, shown in 30c, the MEBES tool performs a re-registration and recalibration. This time consuming step is necessary whenever the base writing unit is changed. As is known in the art, the command GC=1 shown in Table 1 (applied to CHIPs 2–200) reduces the other recalibrations undertaken by the MEBES tool to the minimum required to obtain properly scaled segments. As shown in 30d, the MEBES tool writes the grating pattern by exposing the photoresist according to the new base writing unit at the axis location defined in the jobdeck.

After writing a segment to the substrate, the MEBES tool checks the jobdeck for the next segment. As shown at 30e of FIG. 1, the MEBES tool will repeat the steps shown at 30a–30d until the last of the grating segments has been written to the substrate and the array is complete. When the mask has been fully exposed, it is processed and used to form a chirped fiber Bragg grating in an optical fiber in the conventional manner as described above, and shown in blocks 40 and 50.

Unfortunately, despite minimizing throughput overhead added due to recalibration of the MEBES tool to its minimum, the repetition of steps 30a–30d still requires that for each successive segment the base writing unit must be redefined to correspond to the new scale factor for that segment. Because the pitch of each segment changes relative to the previous segment in a chirped Bragg grating mask, the repeated recalibrations necessary at steps 30b and 30c can add significant throughput overhead, especially for masks having an array with a large number of segments. This disadvantage can result in fabrication times for a typical 200 segment chirped Bragg grating phase mask to be over 8 hours. From a commercial standpoint, this write time limits both the number of segments and the overall number of index modulations that can be written onto the mask, and ultimately printed to the optical fiber.

Additionally, the technique is not sufficiently accurate for many fiber Bragg grating applications. Stitching and pitch errors have been observed using the scale factor method that result in phase errors and unacceptable levels of a phenomenon known as group delay ripple (GDR) in the chirped Bragg grating ultimately printed on the fiber using the mask. GDR is the wavelength dependent deviation from the theoretical group delay. Group delay is the time delay response curve across the reflected bandwidth of a chirped Bragg grating. GDR is normally reported as the maximum peak to peak deviations from this curve measured in picoseconds. A measurement of GDR indicates the degree to which spatially induced wavelength dispersions are corrected by the fiber Bragg grating. For example, errors typical in chirped fiber Bragg gratings made with masks fabricated using the scale factor method on the MEBES III measure 60 picoseconds of GDR. The MEBES 4500, executing the same jobdeck has produced masks measured at 30 picoseconds of GDR. Although the MEBES 4500 represents an improvement over the MEBES III, neither tool approaches the accuracy needed for critical applications such as those in telecommunications, typically better than 10 picoseconds of GDR.

It is known in the art to reduce GDR in a phase mask for a chirped fiber Bragg grating by using a multipass writing strategy. For example, when writing a grating mask on an e-beam tool such as the MEBES or similar lithography tool using a multipass technique employing four passes, the intensity of the image writing element is reduced to ¼ of the intensity used to expose the substrate during a single pass. By shifting the error boundaries, stitching error is reduced.

Although methods such as the multipass strategy achieve achieving a sufficiently low GDR value in a mask produced by an e-beam or similar lithography tool, application of the technique is rendered commercially impossible using the method of the prior art. At the typical rate discussed above exceeding 8 hours per pass using the scale factor method, the production time for a finished phase mask for a chirped fiber Bragg grating applying the multipass technique can be measured in days. Although other lithography tools may have different write times, the effect of repeated recalibration of basic operational units is similarly time-consuming.

Therefore a need exists for a method for writing chirped fiber Bragg grating phase masks using an e-beam or other lithography tool that significantly reduces write time by avoiding repeated time-consuming recalibration.

A further need exists for a method for writing chirped fiber Bragg grating phase masks presenting a reduced GDR in the fiber Bragg gratings printed therefrom.

SUMMARY OF THE INVENTION

In accordance with the invention, a phase mask for a chirped fiber Bragg grating defined by a series of scale factors is made without repeated recalibrations, thereby reducing throughput overhead. Instead, the scale factors are converted into correction factors, or alpha corrections for each segment. The position of each segment in the array that comprises the mask is adjusted to compensate for shifts in segment position due to application of the correction factor. This adjustment can be made following the selection of a fixed "center point" from which the correction factor is measured in order to assure accurate stitching in the mask pattern.

Thus, the phase mask for the chirped fiber Bragg grating is made in the customary manner by exposing a photoresist-coated substrate to an electron beam or other lithographic instrument which writes the mask pattern into the substrate which is then developed and etched. The resulting phase mask is used to write a chirped Bragg grating into an optical fiber. However, by utilizing a correction factor at the segment level to produce successive pitch changes in the mask, it is no longer necessary to redefine the base writing unit for each segment. Due to dramatically reduced production times, the application of a multipass write strategy results in a highly accurate phase mask produced lithographically within an improved write time.

DETAILED DESCRIPTION OF THE INVENTION

Figure 1:
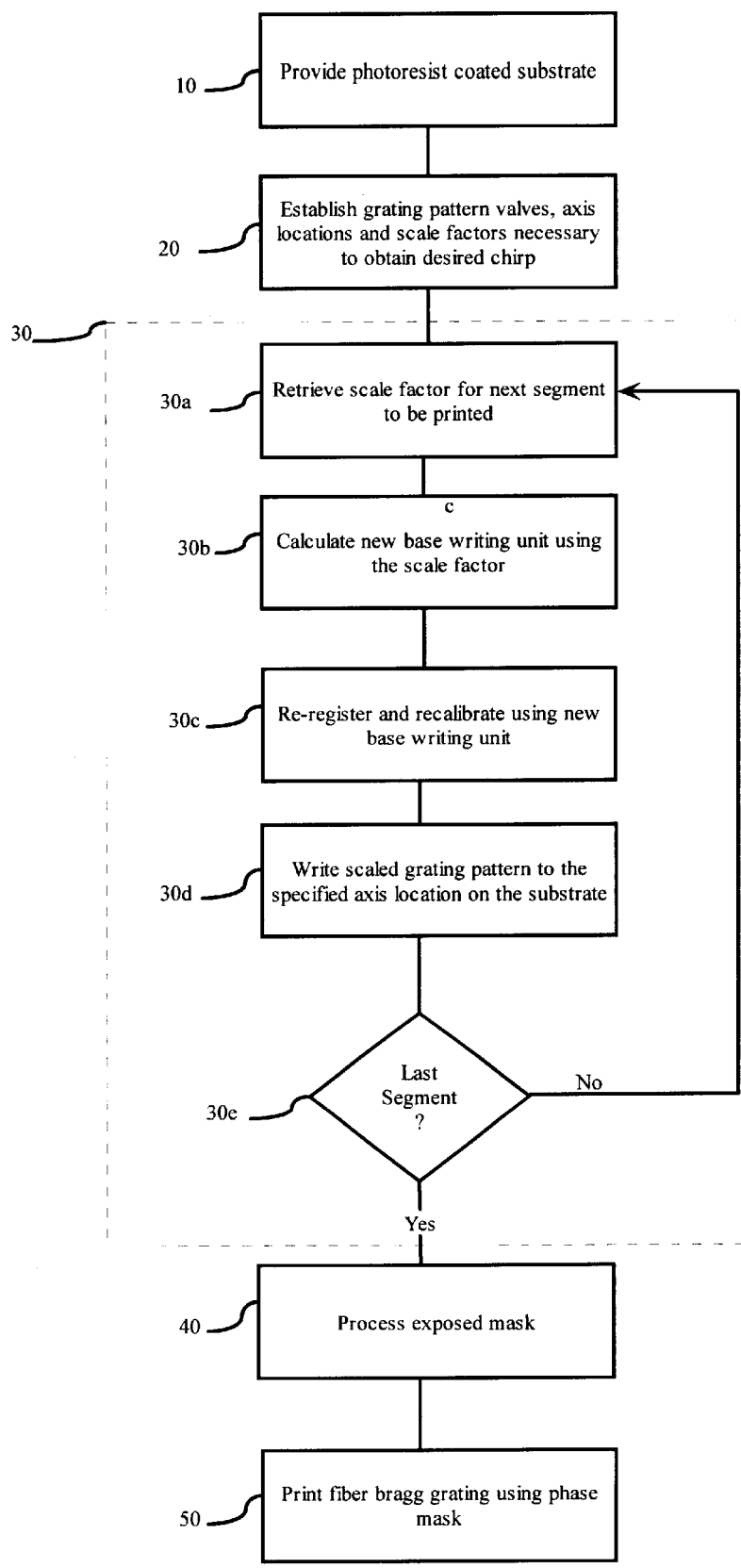
FIG. 1 is a block diagram of the steps in making a chirped fiber Bragg grating using a phase mask produced on a lithography tool using the method of the prior art.
Figure 2:
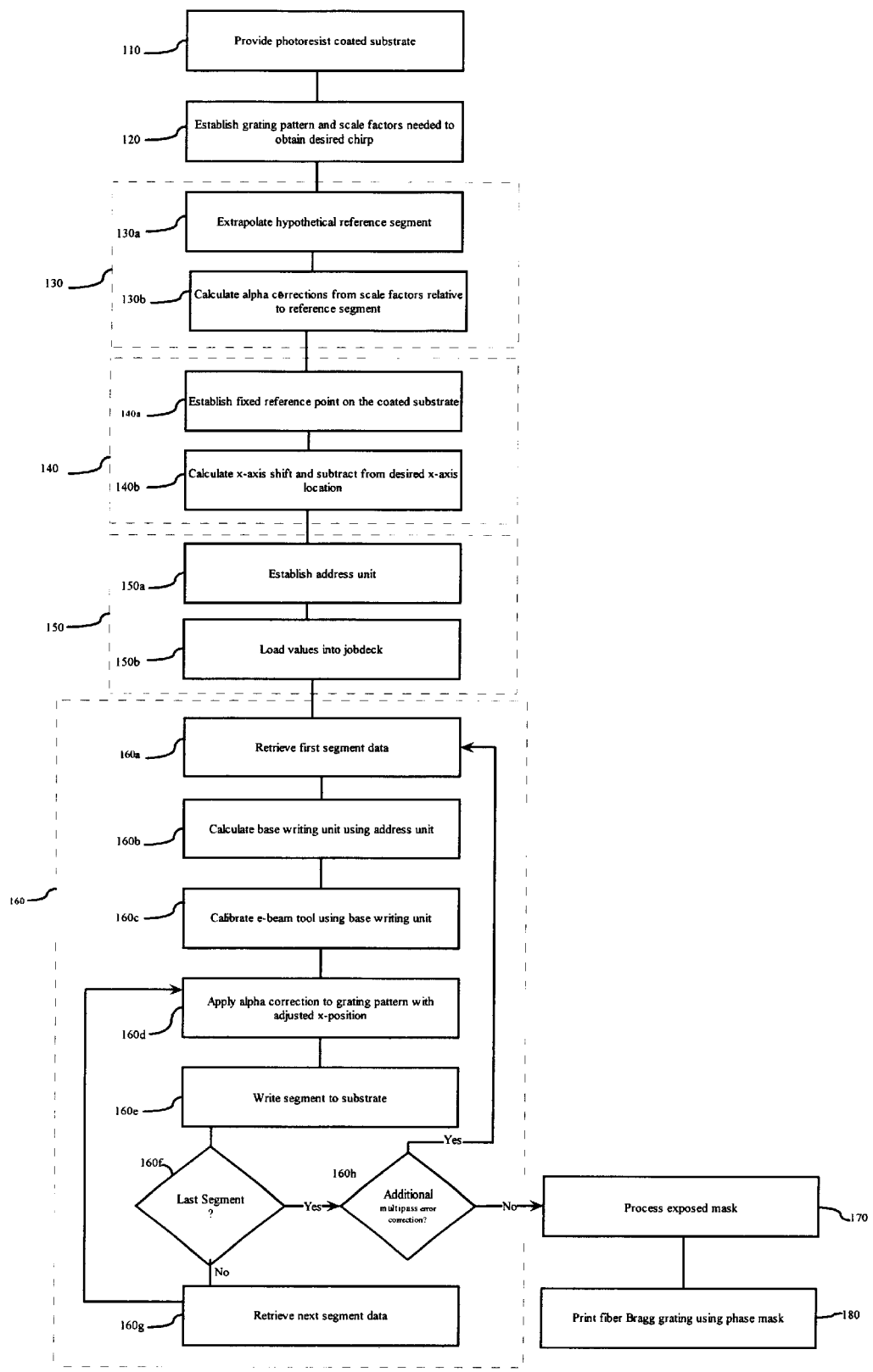
FIG. 2 is a block diagram of the steps in making a chirped fiber Bragg grating having improved accuracy and reduced write-time.

Referring to the drawings, FIG. 2 is a block diagram illustrating the steps in making a chirped fiber Bragg grating on lithography tool such as the MEBES 4500 e-beam tool or similar lithographic tool using the improved machine control method of the present invention. As in the method of the prior art given in FIG. 1, a photoresist coated substrate is loaded onto the stage of the lithography tool, and an appropriate grating pattern and scale factors are chosen as shown in FIG. 2 at 110 and 120 respectively.

However, instead of repeatedly applying scale factors to the address unit, the scale factors used in the method of the prior art are converted to correction factors applied directly to each segment, known for example, to a MEBES tool as "alpha" corrections. In this case X-axis alpha corrections are used because the pitch of each segment is dependent upon its X-axis dimension. A process of converting the scale factors is set forth below. Although the steps provided are directed specifically toward the syntax required for execution on a MEBES tool, it will be understood by one skilled in the art that the process is adaptable to any e-beam or lithography tool having similar capability to those of the MEBES tool. Furthermore, it will be understood that the steps and computations set forth below and in the drawings are merely illustrative of the preferred embodiment of the invention and are not provided for limiting same.

Block 130 of FIG. 2 illustrates two possible steps to make the necessary conversion from scale factor to alpha correction. First, as shown in block 130*a*, a fixed reference scale factor and address unit are chosen, then as shown in block 130*b*, the scale factors can be converted into equivalent segment level correction factors (alpha corrections).

In applying step 130*a*, the scale factor and address unit of any one segment in the grating can provide the needed reference, however it is more convenient to select a hypothetical segment that is just outside the grating to minimize the absolute magnitude of the alpha corrections necessary, and also to prevent a sign change in the value of the corrections from one end of the array of grating segments to the other. A reference scale factor may be extrapolated, for example, by the following equation:

$$SF_{ref}=SF_{last}+(SF_{last}-SF_{last-1})$$

Where $SF_{ref}$ is the scale factor of a hypothetical segment outside the mask, $SF_{last}$ is the last segment in the grating, and $SF_{last-1}$ is the penultimate segment.

Applying the equation numerically, for example, to obtain $SF_{ref}$ for the grating defined by the jobdeck example given in Table 1, where the value for $SF_{last}$ (1.074337300) is found in CHIP 200, and the value for $SF_{last-1}$ (1.074334600) is given in CHIP 199, the equation yields an $SF_{ref}$ of 1.074340000

Having established a reference scale factor, conversion of scale factor values into alpha correction values as called for in step 130*b* is carried out by the following equation:

$$XA_n=(SF_n-SF_{ref})SF_{ref}$$

Where $SF_n$ is the scale factor of the segment to be converted, $SF_{ref}$ is the scale factor of the reference segment and $XA_n$, is the alpha correction in the X-axis dimension of the segment. Following the numeric example given in Table 1, the scale factor for segment 1, given in the jobdeck as CHIP 1, at SF, is 1.0738. Applying the above equation to that value, and incorporating the value for $SF_{ref}$ (1.074340000) derived in the previous step 130*a,* the value for $XA_n$ for segment 1 is –0.000502634. This conversion must be undertaken for each of the segments in the mask prior to submitting the job to the MEBES tool. Therefore, step 130 may be repeated as many times as necessary.

Application of an alpha correction by the MEBES tool results in a specific amount of expansion or contraction of the segment pattern in the X-axis equivalent to the results accomplished by applying a scale factor to the base writing unit according to the method of the prior art. An alpha correction can be used in place of a scale factor because the alpha command effectively "scales" each segment directly. Therefore, the grating pattern ultimately written to the substrate by the MEBES tool should theoretically be the same using either method. However, because the application of an alpha correction does not involve recalibration of the base writing unit, as discussed below, an expected shift in the X-position of the segments is created when an X-Axis alpha correction is applied to the first segment, and accumulates for each subsequent alpha-corrected segment.

The next step, indicated by block 140 of FIG. 2, is to anticipate and correct for the expected shift in the X-position of the segments due to the application of the alpha correction. The magnitude of this shift depends upon the distance of the desired location from a fixed reference point. All shifts using alpha corrections are calculated from the same reference point and all coordinates on the mask will expand or contract around this location for any given alpha value based on whether the sign is positive or negative. For a Mebes 4500 this reference point is a calibration grid mounted on the stage and fixed relative to the substrate. This grid is composed of a 2 mm diameter silicon wafer which has been etched into a 13×13 lattice with bars approximately 38 microns wide and spaced approximately 160 microns apart. The stage coordinates of the intersection of one vertical and one horizontal bar of this grid are stored in a parameter file and used for all image writing element calibrations. Repeated scanning over a long period eventually wears the silicon bars until this location can no longer be used and a new grid intersection must be picked. The stage location of this new intersection is recorded by the MEBES tool. The X value, known on the Mebes 4500 as XFID, is used as the fixed reference point for the calculations to correct X-axis shift. Because XFID, or X-axis mask coordinate can vary by up to 2 mm over time due to the periodic exhaustion of reference points, it is necessary to use the most current number in the calculations. It is ultimately possible for this number to vary by as much as 13 mm since there is a complete second 2 mm grid on the stage for use when the first one is completely worn out. For example an X-axis mask coordinate on one of these grids is 41,157. The chosen coordinate is always stored by the MEBES tool with 0-digit accuracy but all calculations using it are performed to 9-digit accuracy.

The second step, shown in block 140$b$ in FIG. 2 is to calculate an offset X-location, $X_{na}$, on the substrate that, upon application of the alpha correction, will result in the correct placement of each segment relative to the others in the grating given by the following equation:

$$X_{na} = (X_n - X_c)/(1 + A_n) + X_c$$

where $X_n$ is the correct X-location on the grid for segment n to achieve the proper stitching, $A_n$ is the alpha correction applied to segment n, and $X_c$ is the fixed reference or X-axis mask coordinate selected in the previous step, shown in block 140$a$. $X_n$ can be derived from the desired grating established in step 120, and is given for segment 1 numerically, for example, in the sample jobdeck of Table 1 as 13805.6585. Thus, given an $X_c$ fixed numerically at 41,157 in Step 140$a$, the offset X-location for segment 1 in view of its alpha correction value $A_n$ of 0.000502634 is 13791.903872271. In order to ensure proper stitching of each segment, the offset X-location must be calculated for every segment.

The next step, shown in block 150 of FIG. 2, is to establish an address unit, shown in block 150$a$ and to provide the alpha corrections and corresponding offset X-locations to the lithography tool. As noted above and shown in block 150$b$, a jobdeck is used for this purpose on a MEBES tool. The jobdeck of Table 2 mirrors that of Table 1, except that the scale factors are replaced by an X-axis alpha correction preceded by command XA. Therefore, to obtain the same finished mask as called for by the commands in the jobdeck of Table 1, the X-values following the ROWS command in Table 2 are the offset X-values calculated in step 140.

Furthermore, the value for AD in Table 2 may be established by applying the reference scale factor $SF_{ref}$ to the AD of Table 1, thereby fixing the base writing unit to a single value for the entire job. Numerically, the AD of Table 1 (0.125) is multiplied by $SF_{ref}$ (1.07434) yielding an AD for Table 2 of 1.342925.

| Matching jobdeck alpha example | |
|---|---|
| CHIP | 1, (1, PHASEDE-MO-TK, AD = 0.1342925, XA = −0.000502634) |
| ROWS | 62500/13791.903872271 |
| CHIP | 2, (1, PHASEDE-MO-TK, AD = 0.1342925, XA = −0.000500121) |
| ROWS | 62500/14291.540147102 |
| CHIP | 3, (1, PHASEDE-MO-TK, AD = 0.1342925, XA = −0.000497607) |
| ROWS | 62500/14791.175192014 |
| CHIP | 4, (1, PHASEDE-MO-TK, AD = 0.1342925, XA = −0.000495094) |
| ROWS | 62500/15290.80895376 |
| CHIP | 5, (1, PHASEDE-MO-TK, AD = 0.1342925, XA = −0.000492581) |
| ROWS | 62500/15790.441459227 |
| * * * | |
| CHIP | 199, (1, PHASEDE-MO-TK, AD = 0.1342925, XA = −0.000005026) |
| ROWS | 62500/112695.329678025 |
| CHIP | 200, (1, PHASEDE-MO-TK, AD = 0.1342925, XA = −0.000002513) |
| ROWS | 62500/113194.749716305 |

During execution of the jobdeck by the MEBES tool, shown in block 160 of Table 2, the MEBES tool retrieves data for the first segment, CHIP 1 as shown in block 160$a$. The MEBES tool then calculates the base writing unit from the address unit, as shown in block 160$b$, and calibrates itself based on the address unit, as shown in block 160$c$ in the same manner as steps 30$b$ and 30$c$ of FIG. 1. The MEBES next applies the alpha correction to the grating pattern and the offset X-position for the first segment, as shown in block 160$d$, and writes the segment to the substrate as shown in block 160$e$. Because no calibration of the MEBES tool takes place during the application of the alpha correction, the GC=1 command is superfluous and therefore omitted from the jobdeck of Table 2.

In the next step, shown as block 160$f$ of FIG. 2, the MEBES tool checks whether the last segment has been written. If the last segment has not been written, the MEBES tool retrieves the data for the next segment from the jobdeck, as shown in block 160$g$. Because the address unit is the same for every segment, and because the application of alpha corrections by the MEBES tool does not require recalculation of the base writing unit or recalibration steps, the MEBES tool merely applies the next alpha correction to the grating pattern at the corresponding offset X-position and writes the segment to the substrate as shown in blocks 160$d$ and 160$e$. This process is repeated until the last segment has been written to the substrate. When the last segment has been written the mask may be re-exposed according to the multipass technique described above and shown in block 160$h$. If an additional exposure is required, the lithography tool returns to the step shown in block 160$a$. When the last pass is completed the substrate is ready for processing and printing, as known in the prior art and shown in blocks 170 and 180.

As can be seen from the process shown in FIG. 2, when compared to the process conventionally known in the art, the method of the present invention avoids the repeated recalculation and recalibration due to the base writing unit called for in the conventional method. The result is an improvement in write time on the MEBES 4500 from approximately 2.5 minutes per grating segment using the conventional method to approximately 3 seconds per grating segment to execute the equivalent jobdeck. A similar improvement can be expected from any lithography tool carrying out similar sets of commands.

As noted above, significant additional pitch and stitching accuracy, as well as an increase in the number of pitch changes across a finished grating mask can be accomplished by incorporating known techniques such as multipass averaging with the method of the present invention. Because of the significant improvement in write time observed using alpha corrections, it is practical, using this method, to make multiple passes over a single mask in the same or less time than required to write a single pass of a mask using scale factors.

The invention is not limited to the embodiments described above, but all changes and modification thereof not constituting departure from the spirit and scope of the invention are intended to be included.

What is claimed is:

1. A method for fabricating with a lithography tool a phase mask for a chirped fiber Bragg grating having a plurality of progressively chirped grating segments stitched together comprising the steps of:

providing a substrate having a planar surface coated with photoresist;

establishing a fixed reference on said substrate;

establishing a set of scale factors corresponding to said progressive chirp of said grating segments;

calculating a reference scale factor for a hypothetical segment outside of said plurality of progressively chirped grating segments; and calculating a correction factor for each segment using said hypothetical segment as a reference;

dividing said substrate into an array of said plurality of grating segments relative to said fixed reference and according to said correction factor whereby each grating segment is stitched to the segments adjacent thereto;

exposing said photoresist to an image writing element of said lithography tool according to said array;

developing said photoresist; and etching said substrate to produce a phase mask having a plurality of progressively chirped surface relief grating segments.

2. The method of claim 1 wherein the step of exposing said photoresist to said image writing element of said lithography tool according to said array is repeated to perform multipass averaging prior to the developing of said photoresist.

3. The method of claim 1 wherein said array of said plurality of grating segments are comprised of grating segments derived from a common grating pattern.

4. A method for fabricating with a lithography tool a phase mask for a chirped fiber Bragg grating having a plurality of segments each defined by a grating pattern, a scale factor and a position on an axis comprising the steps of:

providing a substrate having a planar surface coated with photoresist;

calculating a reference scale factor for a hypothetical segment outside of said plurality segments;

calculating correction factors from said scale factors relative to said hypothetical segment;

calculating the axis shift of each segment from the position on said axis corresponding to said correction factor;

applying sequentially said correction factor to said grating pattern to divide said substrate into said plurality of segments;

exposing sequentially said photoresist to an image writing element of said lithography tool according to each of said plurality of segments at a position on said substrate corresponding to said axis shift;

developing said photoresist; and etching said substrate.

5. The method of claim 4 wherein the step of exposing sequentially said photoresist to said image writing element of said lithography tool according to each of said plurality of segments at a position on said substrate corresponding to said axis shift is repeated to perform multipass averaging prior to the developing of said photoresist.

* * * * *